(12) United States Patent
Maloberti et al.

(10) Patent No.: US 11,870,430 B2
(45) Date of Patent: Jan. 9, 2024

(54) OVERCURRENT PROTECTION CIRCUIT FOR COMPOSITE TRANSISTOR DEVICES

(71) Applicant: MICROTERA SEMICONDUCTOR (GUANGZHOU) CO., LTD., Guangzhou (CN)

(72) Inventors: Franco Maloberti, Guangzhou (CN); Alper Akdikmen, Guangzhou (CN); Yao Liu, Guangzhou (CN); Sen Liu, Guangzhou (CN); Jianping Li, Guangzhou (CN); Xinglong Liu, Guangzhou (CN); Linsen Shi, Guangzhou (CN); Guichun Ban, Guangzhou (CN); Xiaowei Liu, Guangzhou (CN); Haibin Liu, Guangzhou (CN); Huahua Duan, Guangzhou (CN); Chao Yang, Guangzhou (CN); Jie Yin, Guangzhou (CN)

(73) Assignee: MICROTERA SEMICONDUCTOR (GUANGZHOU) CO., LTD., Guangzhou (CN)

( * ) Notice: Subject to any disclaimer, the term of this patent is extended or adjusted under 35 U.S.C. 154(b) by 0 days.

(21) Appl. No.: 18/017,081

(22) PCT Filed: Jul. 20, 2021

(86) PCT No.: PCT/CN2021/107407
§ 371 (c)(1),
(2) Date: Jan. 20, 2023

(87) PCT Pub. No.: WO2022/017392
PCT Pub. Date: Jan. 27, 2022

(65) Prior Publication Data
US 2023/0268917 A1   Aug. 24, 2023

(30) Foreign Application Priority Data
Jul. 20, 2020   (CN) .......................... 202010695793.9

(51) Int. Cl.
H03K 17/082 (2006.01)
H03K 17/16 (2006.01)
H03K 17/567 (2006.01)

(52) U.S. Cl.
CPC ....... *H03K 17/0828* (2013.01); *H03K 17/168* (2013.01); *H03K 17/567* (2013.01)

(58) Field of Classification Search
CPC . H03K 17/0828; H03K 17/168; H03K 17/567
See application file for complete search history.

(56) References Cited

U.S. PATENT DOCUMENTS

2004/0032701 A1* 2/2004 Yoshida ............. H03K 17/0822
361/93.1
2014/0085760 A1   3/2014 Lui

FOREIGN PATENT DOCUMENTS

| CN | 202433435 U | 9/2012 |
| CN | 203406604 U | 1/2014 |

(Continued)

*Primary Examiner* — Metasebia T Retebo
(74) *Attorney, Agent, or Firm* — Global IP Services; Tianhua Gu

(57) ABSTRACT

An over-current protection circuit for composite transistor devices is provided, connected between an input terminal and a load, and including: a control-terminal voltage-generation module whose output voltage varies with its input voltage when driven by a first voltage, wherein the output voltage of the control-terminal voltage-generation module serves as a control-terminal voltage; a composite transistor device, connected between the control-terminal voltage-generation module and the load, configured to conduct in response to the control-terminal voltage and a second voltage to generate an output current flowing through the load;

(Continued)

and an over-current protection module, connected between the composite transistor device and the load, wherein when the output current of the composite transistor device exceeds a preset limit, a clamping voltage is applied to the composite transistor device by the over-current protection module to limit a current flowing through the composite transistor device, thereby limiting the output current of the composite transistor device.

8 Claims, 3 Drawing Sheets

(56) References Cited

FOREIGN PATENT DOCUMENTS

| | | | |
|---|---|---|---|
| CN | 103840443 | A | 6/2014 |
| CN | 107491134 | A | 12/2017 |
| CN | 111565033 | A | 8/2020 |

* cited by examiner

US 11,870,430 B2

OVERCURRENT PROTECTION CIRCUIT FOR COMPOSITE TRANSISTOR DEVICES

CROSS REFERENCE TO RELATED PATENT APPLICATION

The present application is the US national stage of PCT/CN2021/107407 filed on 2021 Jul. 20, which claims the priority of the Chinese patent application No. 202010695793.9 filed on 2020 Jul. 20, which application is incorporated herein by reference.

FIELD OF TECHNOLOGY

The present disclosure relates to the field of integrated circuits, in particular, to an over-current protection circuit for composite transistor devices.

BACKGROUND

For composite transistor devices, over-current protection is an essential part when it comes to effectively preventing damage to output devices, and over-current protection is realized by limiting the current flowing through the output devices when an over-current event occurs in the circuit, especially when a short circuit occurs on the load.

An existing over-current protection circuit for composite transistor devices, as shown in FIG. 1, protects against over-current by including a sense resistor in its output current path to sense the output current and activating the over-current protection circuit when the sensed current exceeds a current limit. This approach has the following disadvantages: first, the output voltage headroom is limited due to the voltage drop across the sense resistor; second, the high power dissipated across the sense resistor will increase the circuit temperature, which may affect the function of adjacent circuits or even damage them if the temperature increase is too great.

Another existing over-current protection circuit for composite transistor devices, as shown in FIG. 2, limits the output current through a current-limiting feedback loop instead of a sense resistor. One disadvantage of this method is its slow response speed, which may cause the output current to overshoot, allowing it to exceed a preset current limit during the overshooting and thereby damage the output devices. In addition, the method requires stability of the current-limiting feedback loop.

In view of this, it is necessary to design a new over-current protection circuit for composite transistor devices to solve the above technical problems.

SUMMARY

In view of the above-mentioned shortcomings of the prior art, the present disclosure aims to provide an over-current protection circuit for composite transistor devices to solve problems of existing over-current protection circuits, including limited output voltage headroom and high circuit temperature due to sense resistors, and slow response speed due to the current-limiting feedback loop.

To achieve the above purpose and other related purposes, the present disclosure provides an over-current protection circuit for composite transistor devices, connected between an input terminal and a load, wherein the over-current protection circuit comprises:

a control-terminal voltage-generation module, wherein an output voltage of the control-terminal voltage-generation module varies with an input voltage of the control-terminal voltage-generation module when driven by a first voltage, wherein the output voltage of the control-terminal voltage-generation module serves as a control-terminal voltage;

a composite transistor device, connected between the control-terminal voltage-generation module and the load, configured to conduct in response to the control-terminal voltage and a second voltage to generate an output current flowing through the load; and an over-current protection module, connected between the composite transistor device and the load, wherein when the output current of the composite transistor device exceeds a preset limit, a clamping voltage is applied to the composite transistor device by the over-current protection module to limit a current flowing through the composite transistor device, thereby limiting the output current of the composite transistor device.

Optionally, the control-terminal voltage-generation module comprises: a first current source, a second current source, and a PMOS control transistor, wherein a first terminal of the first current source is connected to the first voltage, wherein a second terminal of the first current source is connected to a source of the PMOS control transistor and the input voltage, wherein a drain of the PMOS control transistor is connected to a first terminal of the second current source, wherein a second terminal of the second current source is connected to the second voltage, wherein a gate of the PMOS control transistor is connected to the drain of the PMOS control transistor and serves as an output of the control-terminal voltage-generation module.

Optionally, the composite transistor device comprises: a first transistor and a second transistor, wherein a control terminal of the first transistor is connected to the control-terminal voltage-generation module and the over-current protection module, wherein a first terminal of the first transistor is connected to the over-current protection module, wherein a second terminal of the first transistor is connected to a control terminal of the second transistor, wherein a first terminal of the second transistor is connected to the second voltage, wherein a second terminal of the second transistor is connected to the load, wherein the second terminal of the first transistor is further connected to the second voltage through a first resistor.

Optionally, the first transistor comprises a PMOS transistor, wherein the second transistor comprises an NPN-type transistor, wherein a gate of the PMOS transistor is connected to the control-terminal voltage-generation module and to the over-current protection module, wherein a source of the PMOS transistor is connected to the over-current protection module, wherein a drain of the PMOS transistor is connected to a base of the NPN-type transistor, wherein an emitter of the NPN-type transistor is connected to the second voltage, wherein a collector of the NPN-type transistor connected to the load.

Optionally, the first transistor comprises a PNP-type transistor, wherein the second transistor comprises an NMOS transistor, wherein a base of the PNP-type transistor is connected to the control-terminal voltage-generation module and the over-current protection module, wherein an emitter of the PNP-type transistor is connected to the over-current protection module, wherein a collector of the PNP-type transistor is connected to a gate of the NMOS transistor, wherein a source of the NMOS transistor is connected to the second voltage, wherein a drain of the NMOS transistor is connected to the load.

Optionally, the first transistor comprises a PMOS transistor, wherein the second transistor comprises an NMOS transistor, wherein a gate of the PMOS transistor is connected to the control-terminal voltage-generation module and the over-current protection module, wherein a source of the PMOS transistor is connected to the over-current protection module, wherein a drain of the PMOS transistor is connected to a gate of the NMOS transistor, wherein a source of the NMOS transistor is connected to the second voltage, wherein a drain of the NMOS transistor is connected to the load.

Optionally, the first transistor comprises a PNP-type transistor, wherein the second transistor comprises an NPN-type transistor, wherein a base of the PNP-type transistor is connected to the control-terminal voltage-generation module and the over-current protection module, wherein an emitter of the PNP-type transistor is connected to the over-current protection module, wherein a collector of the PNP-type transistor is connected to a base of the NPN-type transistor, wherein an emitter of the NPN-type transistor is connected to the second voltage, wherein a collector of the NPN-type transistor connected to the load.

Optionally, the over-current protection module comprises: a diode string and a second resistor, wherein an anode of the diode string is connected to a first terminal of the second resistor and to the load, wherein a cathode of the diode string is connected to the control terminal of the first transistor, wherein a second terminal of the second resistor is connected to the first terminal of the first transistor, wherein the diode string comprises N diodes connected in series, N being a positive integer greater than 1.

Optionally, the second resistor is an adjustable resistor.

As described above, the over-current protection circuit for composite transistor devices proposed by the present disclosure achieves over-current protection for composite transistor devices, by including a control-terminal voltage-generation module, a composite transistor device, and an over-current protection module; also, the over-current protection circuit avoids the problem of high circuit temperature by reducing the power dissipated across the resistor, and further avoids the problem of output current overshooting by ensuring a fast response speed.

Figure 1:
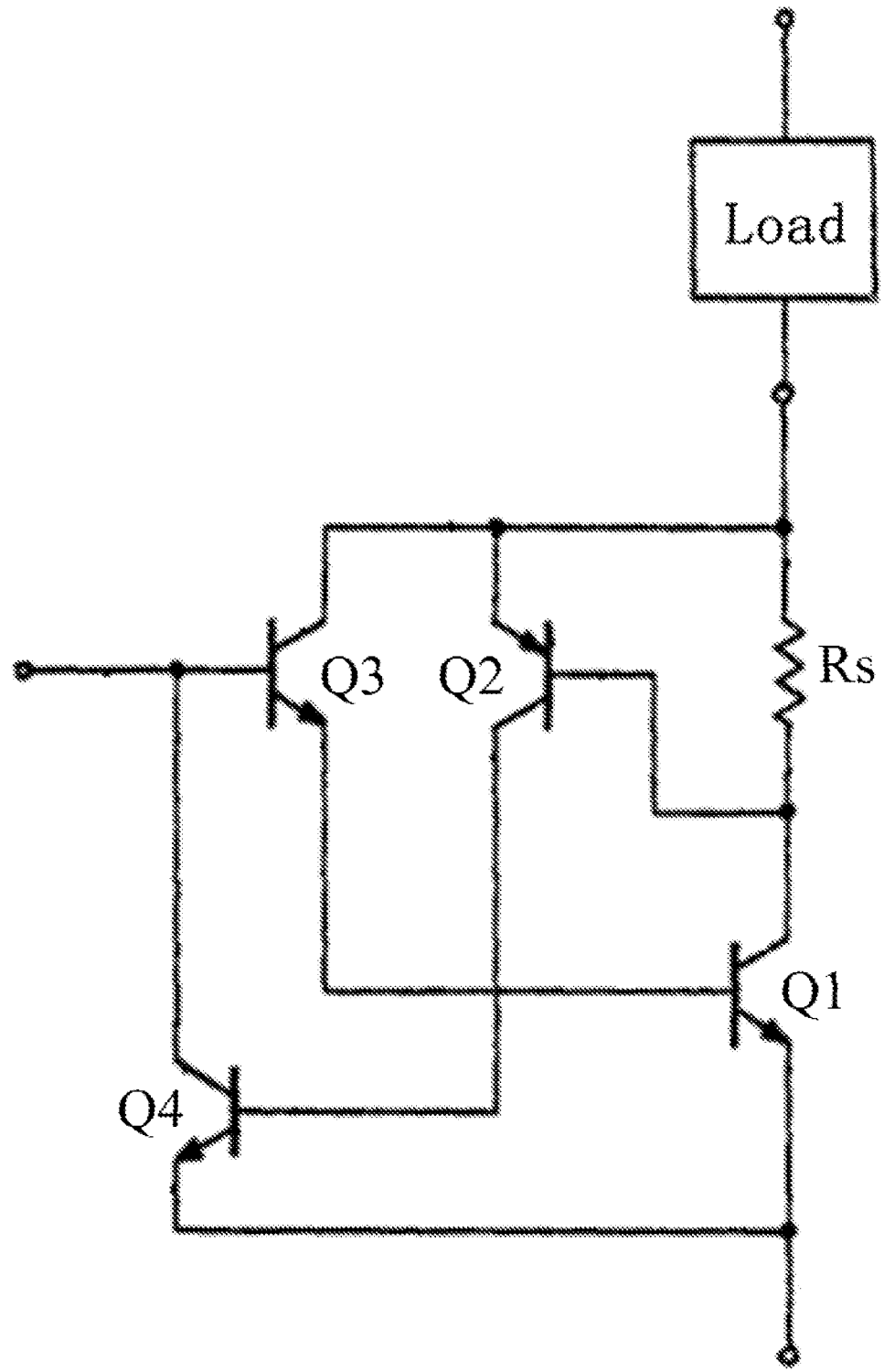
FIG. 1 shows a schematic diagram of an existing over-current protection circuit for composite transistor devices.
Figure 2:
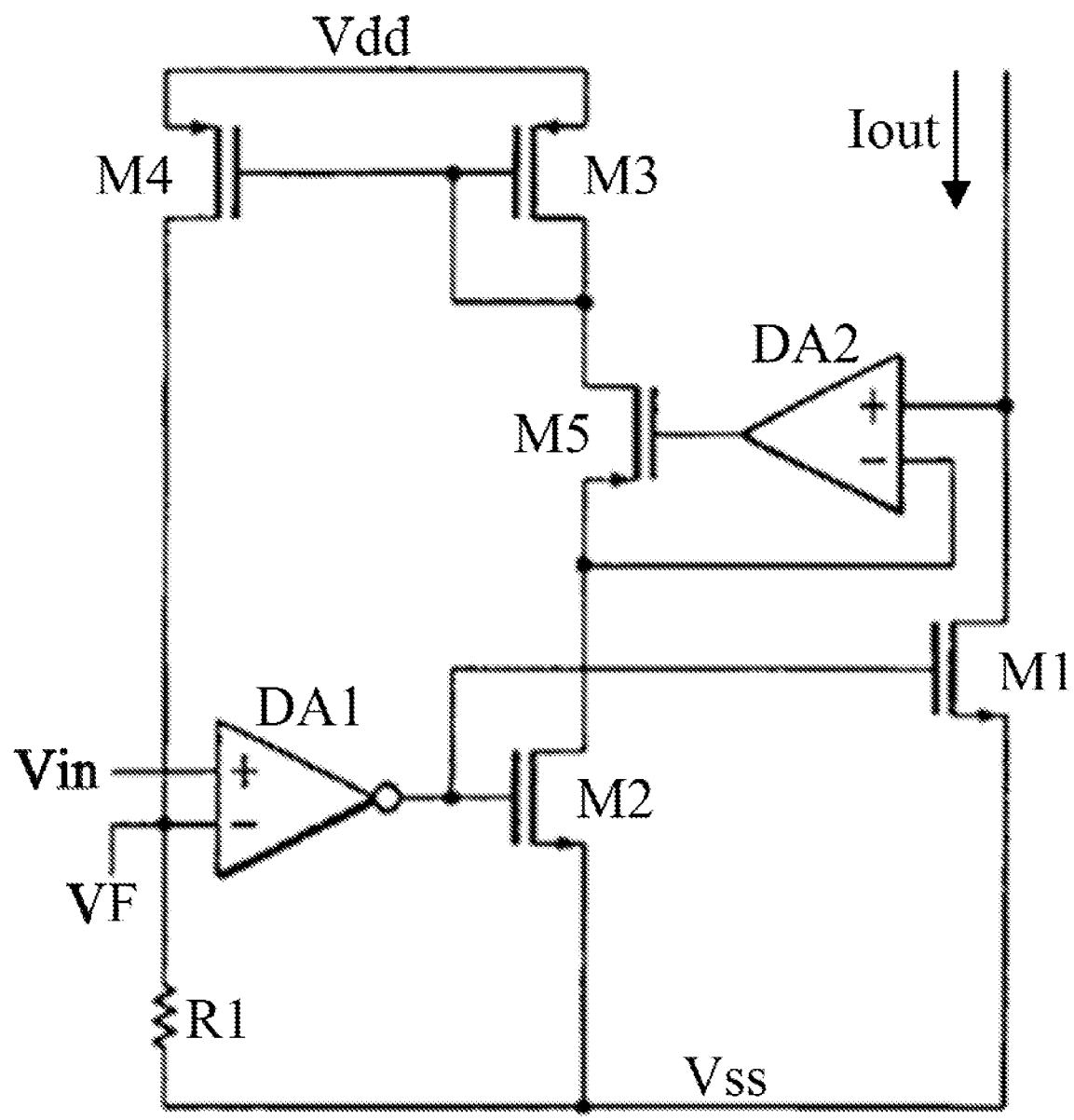
FIG. 2 shows a schematic diagram of another existing over-current protection circuit for composite transistor devices.

REFERENCE NUMERALS 100 control-terminal voltage-generation module
200 composite transistor device
300 over-current protection module

DETAILED DESCRIPTION

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Figure 3:
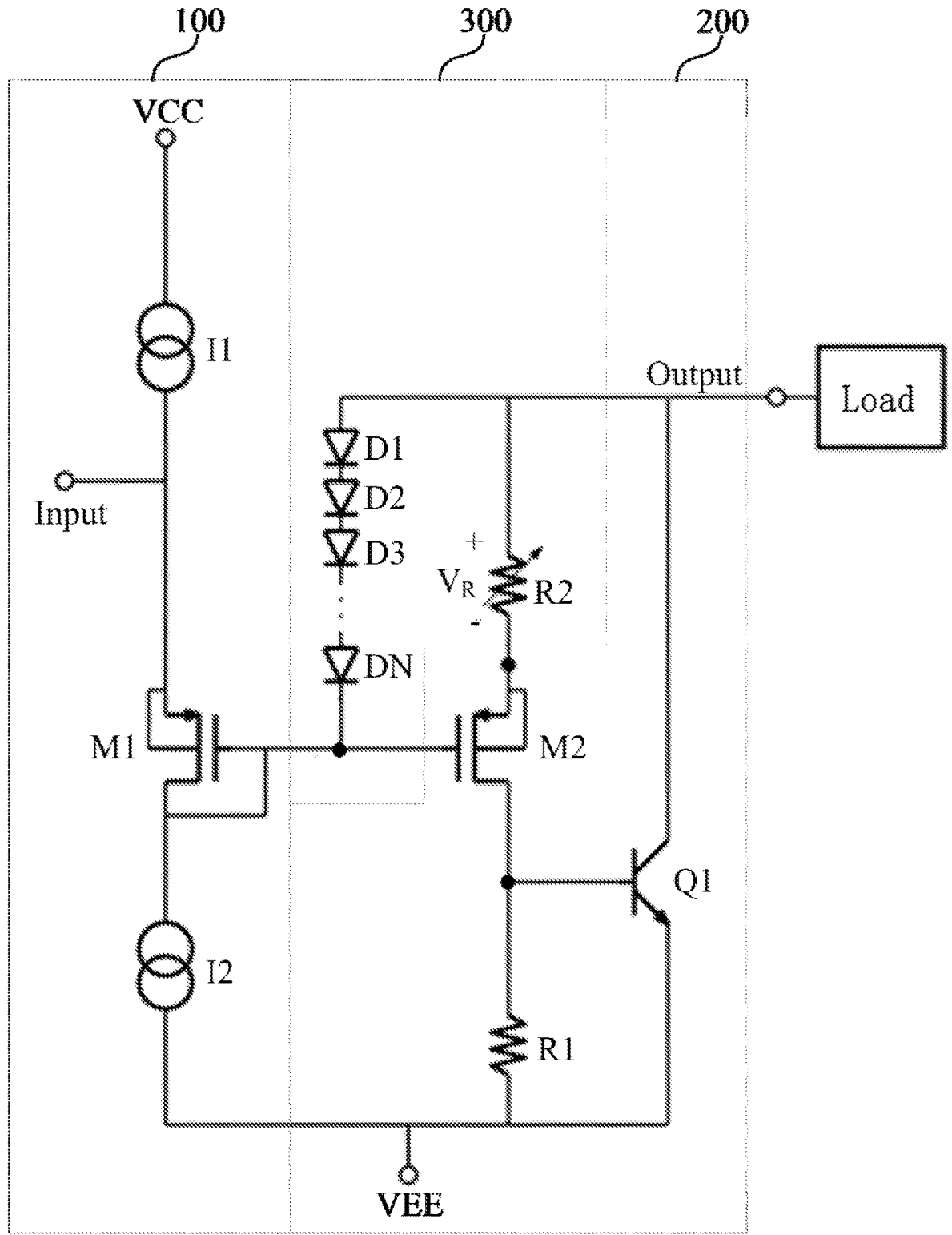
FIG. 3 shows a schematic diagram of an over-current protection circuit for composite transistor devices according to an embodiment of the present disclosure.

Refer to FIG. 3. It needs to be stated that the drawings provided in the following embodiments are used for schematically describing the basic concept of the present disclosure, thus only illustrating components closely related to the present disclosure and are not drawn according to the numbers, shapes and sizes of components during actual implementation, the configuration, number and scale of each component during actual implementation thereof may be freely changed, and the component layout configuration thereof may be more complex.

Embodiment 1

As shown in FIG. 3, Embodiment 1 provides an over-current protection circuit for composite transistor devices, connected between an input terminal and a load, wherein the over-current protection circuit comprises:

a control-terminal voltage-generation module 100, wherein an output voltage of the control-terminal voltage-generation module 100 varies with an input voltage of the control-terminal voltage-generation module 100 when driven by a first voltage VCC, wherein the output voltage of the control-terminal voltage-generation module 100 serves as a control-terminal voltage;

a composite transistor device 200, connected between the control-terminal voltage-generation module 100 and the load, configured to conduct in response to the control-terminal voltage and a second voltage VEE to generate an output current flowing through the load; and an over-current protection module 300, connected between the composite transistor device 200 and the load, wherein when the output current of the composite transistor device 200 exceeds a preset limit, a clamping voltage is applied to the composite transistor device 200 by the over-current protection module 300 to limit a current flowing through the composite transistor device 200, thereby limiting the output current of the composite transistor device 200.

As an example, as shown in FIG. 3, the control-terminal voltage-generation module 100 comprises: a first current source I1, a second current source I2, and a PMOS control transistor M1, wherein a first terminal of the first current source I1 is connected to the first voltage VCC, wherein a second terminal of the first current source I1 is connected to a source of the PMOS control transistor M1 and the input voltage, wherein a drain of the PMOS control transistor M1 is connected to a first terminal of the second current source I2, wherein a second terminal of the second current source I2 is connected to the second voltage VEE, wherein a gate of the PMOS control transistor M1 is connected to the drain of the PMOS control transistor M1 and serves as an output terminal of the control-terminal voltage-generation module 100. Optionally, a substrate of the PMOS control transistor M1 is shorted to the source of the PMOS control transistor M1, thereby eliminating a body effect of the PMOS control transistor M1 and improving linearity thereof. In one example, the PMOS control transistor M1, biased by the first current source I1 and the second current source I2, has a constant gate-source voltage $V_{GS\_M1}$, so that a voltage at the gate of the PMOS control transistor M1 varies with a voltage at the source of the PMOS control transistor M1 (i.e., the input voltage). Specifically, when the input voltage decreases (i.e., the voltage at the source of the PMOS control transistor M1 decreases), the voltage at the gate of the PMOS control transistor M1 decreases consequently, since the PMOS control transistor M1 has a constant gate-source voltage $V_{GS\_M1}$. Specifically, when the input voltage increases (i.e., the voltage at the source of the PMOS control transistor M1 increases), the voltage at the gate of the PMOS control transistor M1 increases consequently, since the PMOS control transistor M1 has a constant gate-source voltage $V_{GS\_M1}$.

As an example, the composite transistor device 200 comprises: a first transistor and a second transistor, wherein a control terminal of the first transistor is connected to the control-terminal voltage-generation module 100 and the over-current protection module 300, wherein a first terminal of the first transistor is connected to the over-current protection module 300, wherein a second terminal of the first transistor is connected to a control terminal of the second transistor, wherein a first terminal of the second transistor is connected to the second voltage VEE, wherein a second terminal of the second transistor is connected to the load, wherein the second terminal of the first transistor is further connected to the second voltage VEE through a first resistor R1. As shown in FIG. 3, in one example, the first transistor comprises a PMOS transistor M2, wherein the second transistor comprises an NPN-type transistor Q1, wherein a gate of the PMOS transistor M2 is connected to the control-terminal voltage-generation module 100 and to the over-current protection module 300, wherein a source of the PMOS transistor M2 is connected to the over-current protection module 300, wherein a drain of the PMOS transistor M2 is connected to a base of the NPN-type transistor Q1, wherein an emitter of the NPN-type transistor Q1 is connected to the second voltage VEE, wherein a collector of the NPN-type transistor Q1 is connected to the load. Optionally, a substrate of the PMOS control transistor M2 is shorted to the source of the PMOS control transistor M2, thereby eliminating a body effect of the PMOS control transistor M1 and improving linearity thereof. In one example, the PMOS transistor M2 and the NPN-type transistor Q1 form a composite PNP transistor, wherein the composite PNP transistor is configured to conduct in response to the control-terminal voltage and the second voltage VEE to generate an output current flowing through the load.

As an example, as shown in FIG. 3, the over-current protection module 300 comprises: a diode string (D1 to DN) and a second resistor R2, wherein an anode of the diode string (D1 to DN) is connected to a first terminal of the second resistor R2 and to the load, wherein a cathode of the diode string (D1 to DN) is connected to the control terminal of the first transistor, wherein a second terminal of the second resistor R2 is connected to the first terminal of the first transistor, wherein the diode string (D1 to DN) comprises N diodes connected in series, N being a positive integer greater than 1. In one example, as shown in FIG. 3, the anode of the diode string (D1 to DN) is connected to the first terminal of the second resistor R2 and to the load, wherein the cathode of the diode string (D1 to DN) is connected to the gate of the PMOS transistor M2, wherein the second terminal of the second resistor R2 is connected to the source of the PMOS transistor M2. In one example, when the output current flowing through the load starts to increase, the current flowing through the second resistor R2 increases, at which time a voltage drop $V_R$ across the second resistor R2 and a gate-source voltage $V_{SG\_M2}$ of the PMOS transistor M2 also increase as a result; as the output current flowing through the load continues to increase, the sum of the voltage drop $V_R$ across the second resistor R2 and the gate-source voltage $V_{SG\_M2}$ of the PMOS transistor M2 ($V_R+V_{SG\_M2}$) gradually approaches a voltage drop across the diode string (D1 to DN), i.e. $N*V_D$, where $V_D$ is the on-state voltage of an individual diode; when the output current flowing through the load reaches the preset limit, the sum of the voltage drop $V_R$ across the second resistor R2 and the gate-source voltage $V_{SG\_M2}$ of the PMOS transistor M2 ($V_R+V_{SG\_M2}$) equals $N*V_D$, therefore clamping the gate-source voltage $V_{SG\_M2}$ of the PMOS transistor M2 to the range of ($N*V_D-V_R$), therefore limiting a current at the drain of the PMOS transistor M2 and a current at the collector of the NPN-type transistor Q1 to fixed values, and therefore achieving over-current protection. Due to the large ratio of the current at the collector of the NPN-type transistor Q1 to the current at the drain of the PMOS transistor M2, a maximum current flowing through the second resistor R2 is relatively small compared to a maximum output current flowing through the load, therefore avoiding the problem of high circuit temperature by reducing power dissipated across the second resistor R2. Moreover, the use of the diode string (D1 to DN) to clamp the gate-source voltage $V_{SG\_M2}$ of the PMOS transistor M2 is able to take effect immediately, therefore avoiding the problem of output current overshooting by ensuring a fast response speed.

Specifically, the second resistor R2 is an adjustable resistor. In practice, a threshold voltage of the PMOS control transistor M1, a threshold voltage of the PMOS transistor M2, a current gain of the NPN-type transistor Q1, the on-state voltage of individual diodes in the diode string, the resistance of the first resistor R1, and the resistance of second resistor R2 may change depending on the specific process, therefore changing the preset limit of the output current of the composite transistor device 200. Therefore, it is usually necessary to calibrate the over-current protection circuit described herein to prevent the preset limit of the output current of the composite transistor device 200 from being too large for the NPN-transistor Q1 and causing damage to it. In particular, the preset limit of the output current of the composite transistor device 200 can be calibrated by changing the number of diodes connected in series in the diode string (D1 to DN), or by changing the resistance of the second resistor R2; in the former method, the calibration of the preset limit of the output current of the composite transistor device 200 is achieved by changing the number of diodes connected in series in the diode string (D1 to DN), therefore changing the voltage drop across the diode string (D1 to DN), and therefore clamping the gate-source voltage $V_{SG\_M2}$ of the PMOS transistor M2 to different ranges; the former method is simple, but less accurate; in the latter method, the calibration of the preset limit of the output current of the composite transistor device 200 is achieved by changing the resistance of the second resistor R2 to clamp the gate-source voltage $V_{SG\_M2}$ of the PMOS transistor M2 to different ranges; the latter method is relatively complicated, but allows precise settings. In the latter method of calibrating the over-current protection circuit, the output current of the composite transistor device 200 is measured to determine if it exceeds the preset limit; if the output current of the composite transistor device 200 exceeds the preset limit, the resistance of the second resistor R2 is then trimmed continuously by laser ablation (also known as laser trimming), or discretely by laser-fusing fuses (in which case the second resistor R2 is composed of multiple parallel resistors), or by digitally controlling switches (in which case the second resistor R2 is composed of multiple parallel resistors).

Control Example

As shown in FIG. 3, in case of a circuit including the composite transistor device does not include the over-current protection module 300, when the input voltage decreases (i.e., the voltage at the source of the PMOS control transistor M1 decreases), the voltage at the gate of the PMOS control transistor M1 decreases following the input voltage, at which time the gate-source voltage $V_{SG\_M2}$ of the PMOS transistor M2 increases, and the PMOS transistor M2 starts drawing a current from the load and then drives the NPN-type transistor Q1 by a difference between the current drawn from the load and a current given by ($V_B$/R1), where $V_B$ is a base voltage of the NPN-type transistor Q1. The product of the current drawn from the load (i.e., the current flowing through the PMOS transistor M2) and a current gain of the PMOS transistor M2 equals to the current at the collector of the NPN-type transistor Q1, wherein the current at the collector of the NPN-type transistor Q1 is also drawn from the load. Due to a large current gain of the NPN-type transistor Q1, which approximately equals to the ratio of a current flowing through the NPN-type transistor Q1 to a current flowing through the PMOS transistor M2, the current flowing through the NPN-type transistor Q1 will rapidly become large and therefore may damage load-side devices when the circuit including the composite transistor device does not have any current limitation.

Embodiment 2

Compared to Embodiment 1, Embodiment 2 differs in that the first transistor in Embodiment 2 comprises a PNP-type transistor and the second transistor comprises an NMOS transistor, specifically, a base of the PNP-type transistor is connected to the control-terminal voltage-generation module 100 and the over-current protection module 300, an emitter of the PNP-type transistor is connected to the over-current protection module 300, a collector of the PNP-type transistor is connected to a gate of the NMOS transistor, a source of the NMOS transistor is connected to the second voltage VEE, and a drain of the NMOS transistor is connected to the load. When the over-current protection module 300 comprises a diode string (D1 to DN) and a second resistor R2, an anode of the diode string (D1 to DN) is connected to a first terminal of the second resistor R2 and to the load, a cathode of the diode string (D1 to DN) is connected to the base of the PNP-type transistor, and a second terminal of the second resistor R2 is connected to the emitter of the PNP-type transistor. Optionally, a substrate of the NMOS control transistor is shorted to the source of the NMOS control transistor, thereby eliminating a body effect of the PMOS control transistor and improving linearity thereof.

Embodiment 3

Compared to Embodiment 1, Embodiment 3 differs in that the first transistor in Embodiment 3 comprises a PMOS transistor and the second transistor comprises an NMOS transistor; specifically, a gate of the PMOS transistor is connected to the control-terminal voltage-generation module 100 and the over-current protection module 300, a source of the PMOS transistor is connected to the over-current protection module 300, a drain of the PMOS transistor is connected to a gate of the NMOS transistor, a source of the NMOS transistor is connected to the second voltage VEE, and a drain of the NMOS transistor is connected to the load. When the over-current protection module 300 comprises a diode string (D1 to DN) and a second resistor R2, an anode of the diode string (D1 to DN) is connected to a first terminal of the second resistor R2 and to the load, a cathode of the diode string (D1 to DN) is connected to the gate of the PMOS transistor, and a second terminal of the second resistor R2 is connected to the source of the PMOS transistor. Optionally, a substrate of the PMOS transistor is shorted to the source of the PMOS transistor, and a substrate of the NMOS transistor is shorted to the source of the NMOS transistor, thereby eliminating body effects of the PMOS transistor and the NMOS transistor and improving linearity thereof.

Embodiment 4

Compared to Embodiment 1, Embodiment 4 differs in that the first transistor in Embodiment 4 comprises a PNP-type transistor and the second transistor comprises an NPN-type transistor; specifically, a base of the PNP-type transistor is connected to the control-terminal voltage-generation module 100 and the over-current protection module 300, an emitter of the PNP-type transistor is connected to the over-current protection module 300, wherein a collector of the PNP-type transistor is connected to a base of the NPN-type transistor, an emitter of the NPN-type transistor is connected to the second voltage VEE, and a collector of the NPN-type transistor connected to the load. When the over-current protection module 300 comprises a diode string (D1 to DN) and a second resistor R2, an anode of the diode string (D1 to DN) is connected to a first terminal of the second resistor R2 and to the load, a cathode of the diode string (D1 to DN) is connected to the base of the PNP-type transistor, and a second terminal of the second resistor R2 is connected to the emitter of the PNP-type transistor.

As described above, the over-current protection circuit for composite transistor devices proposed by the present disclosure achieves over-current protection for composite transistor devices by including a control-terminal voltage-generation module, a composite transistor device, and an over-current protection module; also, the over-current protection circuit avoids the problem of high circuit temperature by reducing the power dissipated across the resistor, and further avoids the problem of output current overshooting by ensuring a fast response speed. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. An over-current protection circuit for composite transistor devices, connected between an input terminal and a load, comprising:
   a control-terminal voltage-generation module, wherein an output voltage of the control-terminal voltage-generation module varies with an input voltage of the control-terminal voltage-generation module when driven by a first voltage, wherein the output voltage of the control-terminal voltage-generation module serves as a control-terminal voltage;

a composite transistor device, connected between the control-terminal voltage-generation module and the load, configured to conduct in response to the control-terminal voltage and a second voltage to generate an output current flowing through the load; and an over-current protection module, connected between the composite transistor device and the load, wherein when the output current of the composite transistor device exceeds a preset limit, a clamping voltage is applied to the composite transistor device by the over-current protection module, to limit a current flowing through the composite transistor device, thereby limiting the output current of the composite transistor device, wherein the composite transistor device comprises: a first transistor and a second transistor, wherein a control terminal of the first transistor is connected to the control-terminal voltage-generation module and the over-current protection module, wherein a first terminal of the first transistor is connected to the over-current protection module, wherein a second terminal of the first transistor is connected to a control terminal of the second transistor, wherein a first terminal of the second transistor is connected to the second voltage, wherein a second terminal of the second transistor is connected to the load, wherein the second terminal of the first transistor is further connected to the second voltage through a first resistor.

2. The over-current protection circuit for composite transistor devices according to claim 1, wherein the control-terminal voltage-generation module comprises: a first current source, a second current source, and a PMOS control transistor, wherein a first terminal of the first current source is connected to the first voltage, wherein a second terminal of the first current source is connected to a source of the PMOS control transistor and the input voltage, wherein a drain of the PMOS control transistor is connected to a first terminal of the second current source, wherein a second terminal of the second current source is connected to the second voltage, wherein a gate of the PMOS control transistor is connected to the drain of the PMOS control transistor and serves as an output of the control-terminal voltage-generation module.

3. The over-current protection circuit for composite transistor devices according to claim 1, wherein the first transistor comprises a PMOS transistor, wherein the second transistor comprises an NPN-type transistor, wherein a gate of the PMOS transistor is connected to the control-terminal voltage-generation module and to the over-current protection module, wherein a source of the PMOS transistor is connected to the over-current protection module, wherein a drain of the PMOS transistor is connected to a base of the NPN-type transistor, wherein an emitter of the NPN-type transistor is connected to the second voltage, wherein a collector of the NPN-type transistor is connected to the load.

4. The over-current protection circuit for composite transistor devices according to claim 1, wherein the first transistor comprises a PNP-type transistor, wherein the second transistor comprises an NMOS transistor, wherein a base of the PNP-type transistor is connected to the control-terminal voltage-generation module and the over-current protection module, wherein an emitter of the PNP-type transistor is connected to the over-current protection module, wherein a collector of the PNP-type transistor is connected to a gate of the NMOS transistor, wherein a source of the NMOS transistor is connected to the second voltage, wherein a drain of the NMOS transistor is connected to the load.

5. The over-current protection circuit for composite transistor devices according to claim 1, wherein the first transistor comprises a PMOS transistor, wherein the second transistor comprises an NMOS transistor, wherein a gate of the PMOS transistor is connected to the control-terminal voltage-generation module and the over-current protection module, wherein a source of the PMOS transistor is connected to the over-current protection module, wherein a drain of the PMOS transistor is connected to a gate of the NMOS transistor, wherein a source of the NMOS transistor is connected to the second voltage, wherein a drain of the NMOS transistor is connected to the load.

6. The over-current protection circuit for composite transistor devices according to claim 1, wherein the first transistor comprises a PNP-type transistor, wherein the second transistor comprises an NPN-type transistor, wherein a base of the PNP-type transistor is connected to the control-terminal voltage-generation module and the over-current protection module, wherein an emitter of the PNP-type transistor is connected to the over-current protection module, wherein a collector of the PNP-type transistor is connected to a base of the NPN-type transistor, wherein an emitter of the NPN-type transistor is connected to the second voltage, wherein a collector of the NPN-type transistor connected to the load.

7. The over-current protection circuit for composite transistor devices according to claim 1, wherein the over-current protection module comprises: a diode string and a second resistor, wherein an anode of the diode string is connected to a first terminal of the second resistor and to the load, wherein a cathode of the diode string is connected to the control terminal of the first transistor, wherein a second terminal of the second resistor is connected to the first terminal of the first transistor, wherein the diode string comprises N diodes connected in series, N being a positive integer greater than 1.

8. The over-current protection circuit for composite transistor devices according to claim 7, wherein the second resistor is an adjustable resistor.

* * * * *